United States Patent [19]

Carter

[11] Patent Number: 4,945,069
[45] Date of Patent: Jul. 31, 1990

[54] ORGANIC SPACE HOLDER FOR TRENCH PROCESSING

[75] Inventor: Duane E. Carter, Plano, Tex.

[73] Assignee: Texas Instruments, Incorporated, Dallas, Tex.

[21] Appl. No.: 285,910

[22] Filed: Dec. 16, 1988

[51] Int. Cl.⁵ .................. H01L 21/312; H01L 21/336
[52] U.S. Cl. ........................ 437/67; 437/52; 437/203; 437/228; 437/229
[58] Field of Search ............ 437/67, 52, 203, 228, 437/229

[56] References Cited

U.S. PATENT DOCUMENTS 4,683,486  7/1987  Chatterjee ................ 357/23.6
4,790,903  12/1988  Sugano et al. ............. 156/643

FOREIGN PATENT DOCUMENTS 0198590   10/1986  European Pat. Off.
59-167035  9/1984  Japan ..................... 437/67
59-191351 10/1984  Japan ..................... 437/67
61-102751  5/1986  Japan ..................... 437/67
61-168241  7/1986  Japan ..................... 437/67

Primary Examiner—Olik Chaudhuri
Attorney, Agent, or Firm—Douglas A. Sorensen; James T. Comfort; Melvin Sharp

[57] ABSTRACT

A void (60) is created in a semiconductor substrate (52) by forming a cavity which is subsequently filled with an organic polymer (66). The organic polymer is masked and etched to form a spacer. A dielectric (70) fills the portions of the cavity where the organic polymer was etched away. The organic polymer is subsequently etched leaving a void.

16 Claims, 1 Drawing Sheet

ORGANIC SPACE HOLDER FOR TRENCH PROCESSING

TECHNICAL FIELD OF THE INVENTION

This invention relates in general to integrated circuits, and more particularly to a method and apparatus for maintaining a space within a trench.

BACKGROUND OF THE INVENTION

During semiconductor processing, it is often necessary to reserve a space within a cavity or trench for later processing. For example, during the fabrication of trench-transistor memory cells, a space must be reserved within a partially filled trench for later formation of a wordline. Trench-transistor memory cells are described in more detail in U.S. Pat. No. 4,830,978 by Teng et al., entitled "DRAM Cell and Method," which is incorporated by reference herein.

Typically, a polysilicon spacer is used to reserve space in a partially filled trench. To form the polysilicon spacer, the uppermost portion of the trench is filled with polysilicon, which is subsequently etched to form the spacer. The remaining portion of the trench is filled with a dielectric which surrounds the spacer, and subsequently the polysilicon spacer is removed leaving a void in the trench for the wordline.

This approach has several problems. The polysilicon etched away to form the spacer leaves a residue on the sidewall of the trench. This residue may create an unwanted diffused region on the sidewall during later processing steps. Because etching processes for polysilicon will affect the other materials used in forming the device, namely the dielectric layers formed on the trench sidewalls, the polysilicon is difficult to strip completely without the danger of damaging the dielectric layers. The same problem associated with forming trench-transistors is present in other semiconductor processes which require a spacer to be formed within a cavity.

Therefore, a need has arisen in the industry to provide a method and apparatus for providing a space within a filled cavity which does not leave residue on the sidewalls of the cavity.

SUMMARY OF THE INVENTION

In accordance with the present invention, a method and apparatus for forming spaces within a material layer is provided which substantially eliminates or prevents the disadvantages associated with the prior art.

In a first aspect of the present invention, a spacer is formed within a material layer. The spacer comprises an organic material, such as a polyimide, or other polymer, which can withstand the temperature of forming a conformal dielectric, such as a conformal oxide. A spacer may be formed from a layer of organic material using a suitable etch, such as an oxygen ($O_2$) plasma etch, which is highly selective to non-organic materials. The organic material is removed using an $O_2$ plasma etch to create a void within the material layer. The void may be filled with a desired material.

The present invention provides a significant advantage over the prior art in that the organic material may be completely removed using an etch which is highly selective to the other material used in the integrated circuit. Hence, the formation of residue in the material layer of the cavities is not a problem.

In the second aspect of the present invention, a trench-transistor is formed using an organic spacer. First, a trench is formed in the semiconductor substrate and a conducting region is formed within the bottom portion of the trench defining a cavity in the upper portion of the trench. The cavity is filled using an organic material, such as a polyimide, and a spacer is formed within the cavity by removing portions of the organic material. The dielectric region is formed within the cavity around the spacer region, and the spacer region is subsequently removed to create a void. Thereafter, polysilicon is formed within the void to create the gate to the trench-transistor.

This aspect of the present invention provides a trench-transistor which prevents undesirable diffused regions caused by residue from a polysilicon spacer.

BRIEF DESCRIPTION OF THE DRAWINGS

For a more complete understanding of the present invention and the advantages thereof, reference is now made to the following description now taken in conjunction with the accompanying drawings in which.

DETAILED DESCRIPTION OF THE INVENTION

The preferred embodiment of the present invention is best understood by referring to FIGS. 1-2 of the drawings, like numerals being used for like and corresponding parts of the various drawings.

Figure 1A:
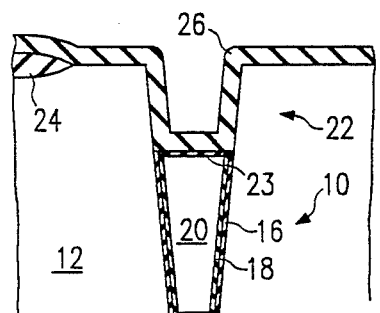
FIG. 1a illustrates a cross-sectional side view of a first embodiment of a trench-transistor using the present invention after a first processing stage.

FIG. 1a illustrates a cross-sectional side view of a first embodiment of the present invention shown in conjunction with a trench-transistor cell. A trench 10 is formed in a substrate 12 to a predetermined depth. For purposes of this specification, "trench" refers to a cavity made in a material layer, and does not connote any particular shape of cavity. A thin oxide layer 16 and a thin nitride layer 18 are formed on the sidewalls and bottom of the trench 10. A doped polysilicon plug 20 is formed within the trench 10. The polysilicon plug 20, oxide layer 16 and nitride layer 18 are etched back to a predetermined depth within the trench to define a cavity 22. A thin dielectric layer 23 is formed over the plug 20. A thermal oxide region 24 is formed on the surface of the substrate 12 and a nitride layer 26 is deposited over the substrate 12 and into the cavity 22. The nitride 26 has a thickness of around 1200 angstroms. The formation of the trench and plug are described in greater detail in the U.S. Pat. application Ser. No. 026,356 by Teng et al.

Figure 1B:
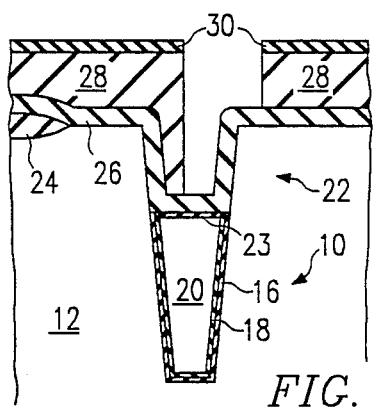
FIG. 1b illustrates a cross-sectional side view of the first embodiment of a trench-transistor using the present invention after a second processing stage.

FIG. 1b illustrates a cross-sectional side view of a first embodiment of the present invention after a second processing stage. An organic polymer, such as polyimide (sold under various trade names such as DuPont Tyralin), is spun on the substrate 12 to a thickness between 5000 angstroms and 1 micrometer. The organic polymer layer 28 should be substantially planar. A hard mask 30, typically a 1000 angstrom oxide or polysilicon layer, is formed over the organic polymer layer 28. The hard mask 30 is patterned with photoresist to cover portions of the organic layer 28 used as a spacer. The exposed portion of the hard mask 30 is removed and an anisotropic etch is performed on the organic polymer layer 28, removing a portion of the organic polymer layer 28 in the cavity 22. Typically, a $O_2$ plasma etch is used, the etch being highly selective to non-organic materials. Therefore, over-etching is not a concern while removing the organic polymer layer 28.

In the preferred embodiment, a polyimide is used as the organic polymer. A polyimide can withstand temperatures of over 400° centigrade without degradation, and is therefore well suited as a spacer material since it will not be affected by subsequent low temperature conformal depositions.

Figure 1C:
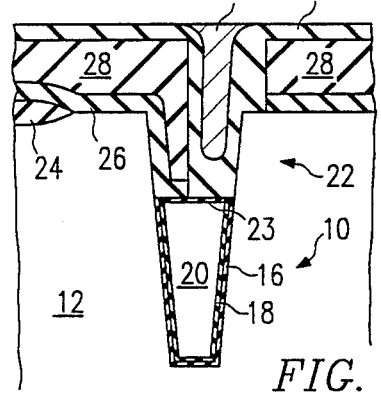
FIG. 1c illustrates a cross-sectional side view of the first embodiment of a trench-transistor using the present invention after a third processing stage.

FIG. 1c illustrates a cross-sectional side view of the first embodiment of the present invention after a third processing stage. The hard mask 30 and portions of the nitride layer 26 not covered by the organic polymer layer 28 are removed. A low temperature (under 400° centigrade) conformal oxide layer 32 is formed over the remaining organic polymer layer 28 and into the cavity 22. If necessary, a spun-on glass layer 34 may be used to fill any void left in the cavity 22 after the conformal oxide deposition. However, using a TEOS-based deposition, it is possible to form a conformal oxide layer without void formation. The conformal oxide layer 32 may have a thickness of about 8000 angstroms.

Figure 1D:
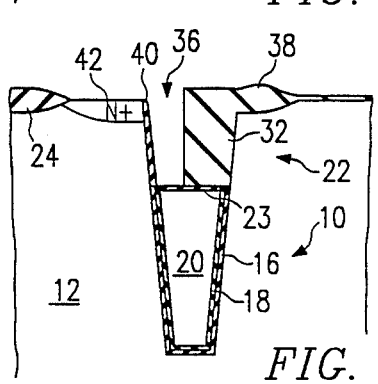
FIG. 1d illustrates a cross-sectional side view of the first embodiment of a trench-transistor using the present invention after a fourth processing stage.

Referring now to FIG. 1d, a cross-sectional side view of the present invention after a fourth processing stage is illustrated. The oxide layer 32 (and glass layer 34) are etched back to the level of the organic polymer layer 28. The organic polymer is then removed using an $O_2$ plasma etch to create a void 36 in the cavity 22. The circuit is subjected to a heat cycle to form a field oxide region 38. The heat cycle will also oxidize the glass layer 34. An anisotropic etch is used to remove portions of the nitride layer 26, leaving a sidewall nitride layer 40. A N-type dopant, such as arsenic (As), is implanted adjacent the trench 10 at the surface of the substrate 12 to form a bitline 42.

Figure 1E:
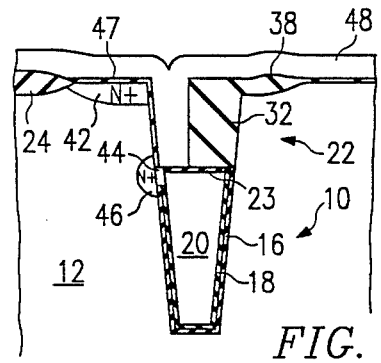
FIG. 1e illustrates a cross-sectional side view of the first embodiment of a trench-transistor using the present invention after a fifth processing stage.

FIG. 1e illustrates a cross-sectional side view of the first embodiment of the present invention after a fifth processing stage. The sidewall nitride layer 40 is removed along with a portion of the oxide and nitride layers 16 and 18. Typically, a depth of approximately 2000 angstroms of the oxide and nitride layers 16 and 18 is removed from a portion of the sidewall of the trench 10. The removed portion of the oxide and nitride layers 16 and 18 is replaced with an undoped polysilicon plug 44, which allows dopants from the polysilicon plug 20 to diffuse into the substrate 12 forming an N. diffused region 46. This process is described in greater detail in U.S. patent application Ser. No. 026,356 by Teng. A pass gate oxide layer 47 is grown on the sidewall of the cavity 22 and a polysilicon layer 48 is formed over the substrate and into the void 36 to form a wordline.

Figure 2A:
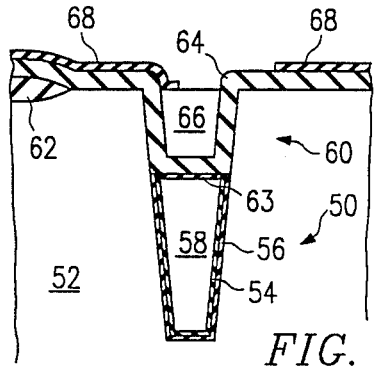
FIG. 2a illustrates a cross-sectional side view of a second embodiment of a trench-transistor using the present invention after a first processing stage.
Figure 2B:
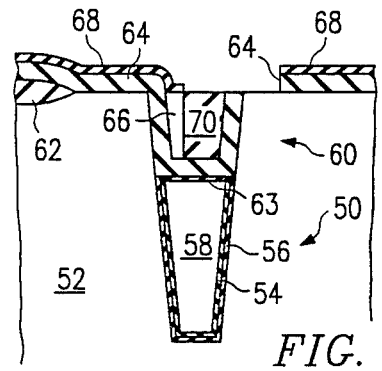
FIG. 2b illustrates a cross-sectional side view of the second embodiment of a trench-transistor using the present invention after a second processing stage.
Figure 2C:
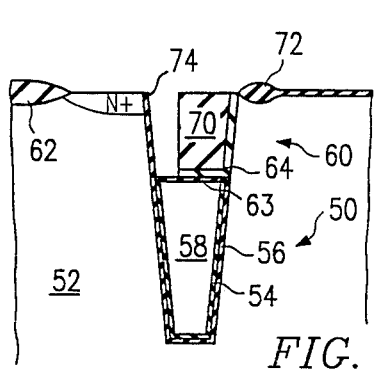
FIG. 2c illustrates a cross-sectional side view of the second embodiment of a trench-transistor using the present invention after a third processing stage.

FIGS. 2a-c illustrate a second embodiment of the present invention. FIG. 2a illustrates a cross-sectional side view of the second embodiment of the present invention after a first processing stage. A trench 50 is formed in a semiconductor substrate 52 as described in connection with FIG. 1a. An oxide layer 54 and nitride layer 56 are formed on the sidewalls and bottom of the trench. The polysilicon plug 58 is formed within the trench and is etched back to define a cavity 60. A field oxide region 62 is formed on the surface of the substrate 52 and an oxide layer 63 is formed over the plug 58 using thermal oxidation processes. A nitride layer 64 is formed over the substrate 52 and in the cavity 60. An organic polymer layer 66 is formed over the substrate and into the cavity 60; however, unlike the process of FIGS. 1a-e, the organic polymer layer 66 is planarized to approximately the surface of the substrate 52. A hard mask 68 is formed over the organic polymer layer 66 to define a spacer and over the nitride layer 64 to define a field oxide region on the periphery of the trench 50.

FIG. 2b illustrates a cross-sectional side view of the second embodiment of the present invention after a second processing stage. The exposed portions of the organic polymer layer 66 are removed using an $O_2$ plasma etch to form the spacer on the sidewall of the cavity 60. A low temperature conformal oxide layer 70 is formed over the surface of the substrate 52 and in the cavity 60. The conformal oxide layer 70 is etched back to form a planar oxide region. As previously discussed, spun-on glass may be used to fill any voids in the cavity 60 after the conformal oxide deposition. The portion of the nitride layer 64 not covered by the hard mask 68 is also etched away.

FIG. 2c illustrates a cross-sectional side view of the second embodiment of the present invention after a third processing stage. After removal of the hard mask 68, a heat cycle creates a field oxide region 72 adjacent the trench 50. The remaining organic polymer layer 66 is removed using an $O_2$ plasma etch leaving a void in the cavity 60 surrounded by the oxide layer 70. The nitride layer 64 is then anisotropically etched to form the sidewall nitride layer 74. The remaining steps needed to fabricate the trench-transistor are the same as those outlined in FIGS. 1d-e.

The present invention provides significant advantages over the prior art. Because a organic material is used to form the spacer within the semiconductor substrate, problems associated with residues are eliminated. Since the organic material can be etched in a process which is highly selective to the other materials used in semiconductor fabrication, the spacer material may be over-etched without effect to the other materials.

The present invention has been illustrated in connection with the formation of a void within a partially filled cavity. The invention could also be used to form a space within a material layer by first forming an organic spacer, by patterning and etching a layer of organic material. Subsequently, a material layer could be formed around the organic spacer. Removal of the organic spacer would create a void in the material layer.

Although the present invention has been described in detail, it should be understood that various changes, substitutions and alterations can be made herein without departing from the spirit and scope of the invention as defined by the appended claims.

What is claimed is:

1. A method of forming a trench-transistor comprising the steps of:
   forming a trench in a semiconductor substrate;
   forming a conducting region within a bottom portion of said trench defining a cavity in the upper portion of said trench;
   forming a spacer region of an organic material within said cavity;
   forming a dielectric region about said organic spacer region within said cavity;
   removing said organic spacer region to create a void; and
   forming a conducting layer within said void.

2. The method of claim 1 further comprising the step of forming a protective layer over the walls of said cavity prior to forming said spacer region.

3. The method of claim 2 wherein said protective layer comprises a nitride layer.

4. The method of claim 2 further comprising the step of, after removing said spacer region, anisotropically etching the portion of said protective layer which was protected by said spacer region to leave a portion of said protective layer on the sidewall of said cavity.

5. The method of claim 1 wherein said step of forming said spacer region comprises the steps of:
   forming a layer of organic material to fill said cavity;
   planarizing said organic material to a level substantially planar to the upper surface of said substrate; and
   removing a portion of said organic material within said cavity.

6. The method of claim 1 wherein said spacer region comprises polyimide.

7. The method of claim 1 wherein said step of forming a conducting region comprises the step of forming a doped polysilicon layer within said cavity and separated from the walls thereof by a dielectric layer.

8. The method of claim 1 wherein said dielectric region comprises conformally deposited oxide.

9. The method of claim 8 and further comprising the step of forming a glass region to fill any voids left by said conformal oxide layer.

10. The method of claim 1 and further comprising the step of planarizing said dielectric region to expose portions of said spacer region.

11. The method of claim 1 further comprising the step of forming doped regions adjacent said trench.

12. A method for fabrication of a device, comprising the steps of:
   providing a substrate with a cavity formed therein;
   filling said cavity with a first material;
   forming an etch mask partially covering said first material;
   etching said first material where not protected by said etch mask;
   filling the portion of said first material removed by said etching with a second material; and
   removing the remainder of said first material.

13. A method as in claim 12 wherein said first material comprises polyimide.

14. A method as in claim 12 wherein said second material comprises silicon dioxide.

15. A method as in claim 12 wherein said substrate comprises crystalline silicon.

16. A method as in claim 12 wherein said etching is anistropic etching.

* * * * *